United States Patent [19]
Killion et al.

[11] Patent Number: 5,131,046
[45] Date of Patent: Jul. 14, 1992

[54] HIGH FIDELITY HEARING AID AMPLIFIER

[75] Inventors: Mead C. Killion, Elk Grove Village, Ill.; Norman P. Matzen, Campbell, Calif.; Clyde M. Brown, Jr., Cupertino, Calif.; William A. Cole, Mossby, Canada; James B. Compton, Los Gatos, Calif.; Steven J. Iseberg, Schaumburg, Ill.; Jonathan K. Stewart, Bensenville, Ill.; Donald L. Wilson, Roselle, Ill.

[73] Assignee: Etymotic Research Inc., Elk Grove Village, Ill.

[21] Appl. No.: 431,531

[22] Filed: Nov. 3, 1989

[51] Int. Cl.$^5$ .......................... H04R 25/00; H03F 3/45
[52] U.S. Cl. ........................... 381/68.2; 381/68; 381/68.4; 330/254
[58] Field of Search ................. 381/68, 68.2, 102, 101, 381/68.4; 330/254, 279, 307, 294

[56] References Cited

U.S. PATENT DOCUMENTS

| | | | |
|---|---|---|---|
| 3,189,841 | 6/1965 | Druz | 330/279 |
| 3,313,885 | 4/1967 | Aiken | 381/102 |
| 3,729,588 | 4/1973 | Berland | 381/68 |
| 3,764,745 | 10/1973 | Bottcher et al. | 381/68 |
| 3,908,172 | 9/1975 | Ascherman et al. | 330/254 |
| 4,088,963 | 5/1978 | Machida et al. | 330/279 |
| 4,170,720 | 10/1979 | Killion | 381/68 |
| 4,405,831 | 9/1983 | Michelson | 381/68 |
| 4,790,018 | 12/1988 | Preves et al. | 381/68.2 |
| 4,928,074 | 5/1990 | Sato et al. | 330/279 |

FOREIGN PATENT DOCUMENTS

| | | | |
|---|---|---|---|
| 2403161 | 8/1974 | Fed. Rep. of Germany | 381/68 |
| 3231030 | 2/1984 | Fed. Rep. of Germany | 381/68 |
| 078997 | 7/1953 | United Kingdom | 381/68 |

OTHER PUBLICATIONS

Journal of Speech and Hearing Research vol. 25, 15-25, Mar. 1982 Evaluation of High-Fidelity Hearing Aids, M. C. Killion and T. W. Tillman.
Hearing Instruments, vol. 39, No. 10 1988 "an" accoustically visible hearing aid by Mead C. Killion.
Handbook of Hearing Aid Amplification, vol. I; Theoretical and Technical Considerations Ch 3, pp. 45-79 College-Hill Press.

Primary Examiner—James L. Dwyer
Assistant Examiner—Jason Chan
Attorney, Agent, or Firm—McAndrews, Held & Malloy, Ltd.

[57] ABSTRACT

A high fidelity hearing aid amplifier is operable at a very low battery voltage and includes a single integrated circuit chip which provides a variable gain amplifier and gain control circuitry operative at low signal levels to enhance gain at higher frequencies relative to gain at lower frequencies, such circuitry including a logarithmic rectifier arrangement and a peak detector in a compression ratio control circuit. Operation at a low battery voltage is enhanced through a compression ratio control circuit which provides a level shift between an AC output of the logarithmic rectifier arrangement and the peak detector. Current mirrors are provided to obtained balanced and stable operation, and an arrangement is provided for manual control by a user to obtain an optimum response characteristic.

27 Claims, 6 Drawing Sheets

HIGH FIDELITY HEARING AID AMPLIFIER

REFERENCE TO RELATED APPLICATIONS

Reference is made to an application of Mead C. Killion, Ser. No. 07/414,903, filed Sep. 29, 1989 and entitled: "LOW BATTERY DETECTOR AND INDICATOR" and to an application of Mead C. Killion, Ser. No. 07/416,703, filed Oct. 3, 1989 and entitled: "HEARING AID WITH AUDIBLE ALARM". In addition, reference is made to an application of Mead C. Killion, and Donald W. Wilson being filed contemporaneoulsy herewith, Ser. No. 07/431,540, entitled: "VARIABLE ATTENUATOR CIRCUIT". The disclosures of said applications are incorporated by reference.

BACKGROUND OF THE INVENTION

1. Field of the Invention

This invention relates to circuitry for use in a hearing aid and other applications, having very low current consumption and having gain control cicuitry which is readily controlled to obtain optimum desired performance characteristics, which is highly reliable and which is manufacturable at low cost.

2. Background of the Prior Art

The Killion U.S. Pat. No. 4,170,720, issued Oct. 9, 1979 discloses a high fidelity hearing aid which is particularly advantageous for users having a mild to moderate loss of normal sensitivity for low intensity sounds, but who can readily hear sounds above a certain intensity level. It is operative to amplify sound at low sound intensity levels while operating without substantial amplification at sound intensities above a certain level and it includes a number of highly desirable features for obtaining a high dynamic range and for minimizing distortion. In one embodiment, a control voltage is developed by a peak detector connected to the output of an amplifier which responds to signal levels and which has a logarithmic response characteristic. The control voltage is developed at an ungrounded end of a capacitor which is connected to one end terminal of a potentimeter having an opposite end terminal connected through a resistor to supply potential, the potentiometer being coupled a DC buffer amplifier to a voltage controlled resistance which is connected in circuit with a capacitor in the feedback path of a signal amplifier to control gain, the value of the capacitor being selectable to obtain a level dependent variation in frequency response. An optional FET may be connected in shunt relation to a microphone output to limit the signal amplitude at the input of the signal amplifier.

Hearing aid technology and considerations relating thereto are discussed in a paper of Mead C. Killion and Tom W. Tillman, in the Journal of Speech and Hearing Research, Volume 25, 15–25, March 1882 and in chapter 3 at pages 45–77 of Volume I of a Handbook of Hearing Aid Amplification, 1988, chapter 3 being entitled Principles of High Fidelity Hearing Aid Amplification, by Mead C. Killion, and containing a discussion of considertions relating to the Killion U.S. Pat. No. 4,170,720.

The hearing aid as disclosed in U.S. Pat. No. 4,170,720 is highly advantageous but the circuits as disclosed require a supply voltage of at least about 1.4 volts, thereby requiring a cell such as a silver cell which is not now available at reasonable cost. The circuits also use discrete components and are otherwise more expensive to manufacture than would be desirable.

Other hearing aids as proposed in the prior art would have other disadvantages and, so far as is known, no hearing aids have been used or proposed which would have the advantageous operational features disclosed in the Killion patent and which would be operable with low supply voltages while being manufacturable at reasonable cost.

SUMMARY OF THE INVENTION

This invention was evolved with the general object of providing a hearing aid incorporating the advantageous features of the Killion patent and having features which produce improved performance, high reliability and low battery drain, while being readily manufacturable at low cost.

Important aspects of the invention relate to recognition of the sources of problems with the prior art. It is recognized that a source of problems with the circuit of the Killion patent is that a considerable number of discrete components are required to implement the hearing aid as disclosed. In accordance with this invention, a circuit is provided which includes transistors and other components on a single integrated circuit chip, cooperating with a small number of external components to perform the functions performed by the discrete components of the prior design.

In accordance with further important features of the invention, the circuit is operable at a low battery voltage, of on the order of 1.1 volts or less and it has a number of additional features which provide enhanced performance. Some of such features are not limited to use in hearing aids, and it will be understood that the invention is not necessarily limited to the use of features as disclosed herein in hearing aids and that they may be used in other applications.

In a preferred embodiment, a single integrated circuit chip is provided with transistors, diodes, resistor and capacitors thereon for forming a variable gain amplifier and gain control circuitry which provides a level dependent frequency response characteristic, operative at low signal levels to enhance gain at higher frequencies relative to that at lower frequencies. The gain control circuitry preferably includes logarithmic rectifier means operative to develop an AC output signal having a peak value varying as a logarithmic function of a signal level which may be that at the output of the variable gain amplifier. The AC output signal so developed is applied to a peak detector circuit in a compression ratio control circuit to develop a DC signal which is amplified by a DC amplifier and applied to a control input of the variable gain amplifier in order to control gain as a function of signal level as disclosed in the aforementioned U.S. Pat. No. 4,170,720.

An important feature of the compression ratio control circuit relates to connection of an input of the DC amplifier to a compression ratio control resistor to ground with the circuitry being such that the amount of compression is increased in proportion to the resistance of the control resistor.

Additional important features relate to the achievement of proper operation at a low supply voltage and with low current consumption, including, for example, an arrangement in the compression ratio control circuit which provides a level shift between the AC output of the logarithmic rectifier circuit and the peak detector circuit of the compression ratio control circuit.

In the logarithmic rectifier circuit, a logarithmic response characteristic is obtained through diodes connected in the feedback path of an amplifier. An important feature relates to the connection of oppositely poled feedback diodes to opposite ends of an offset diode which is connected in series with an output transistor of the amplifier. The offset diode produces an offset such that the input signal applied to the base of an input transistor may vary above and below ground potential, i.e., with ground as a reference, and the required signal levels are minimized.

Further specific features relate to the use of current mirrors an other features to obtain balanced operation, temperature compensation and highly stable and reliable operation. For example, in the logarithmic rectifier circuit, transistors operate as current mirrors and in conjunction with additional diodes to provide offsets in compensating relation to each other and to the offset provided by the offset diode.

Another specific feature relates to the control of gain to increase independently of signal level as a function of movement of a manually operable element away from a first position and toward a second position at which operation of compression control circuitry is initiated to control gain as a function of signal level. It is found that this feature is highly desirable in actual use of the hearing aid, allowing the user freedom to readily obtain a response characteristic which is optimum for ambient conditions.

This invention contemplates other objects, features and advantages which will become more fully apparent from the following detailed description taken in conjunction with the accompanying drawings.

DESCRIPTION OF PREFERRED EMBODIMENTS

Figure 1:
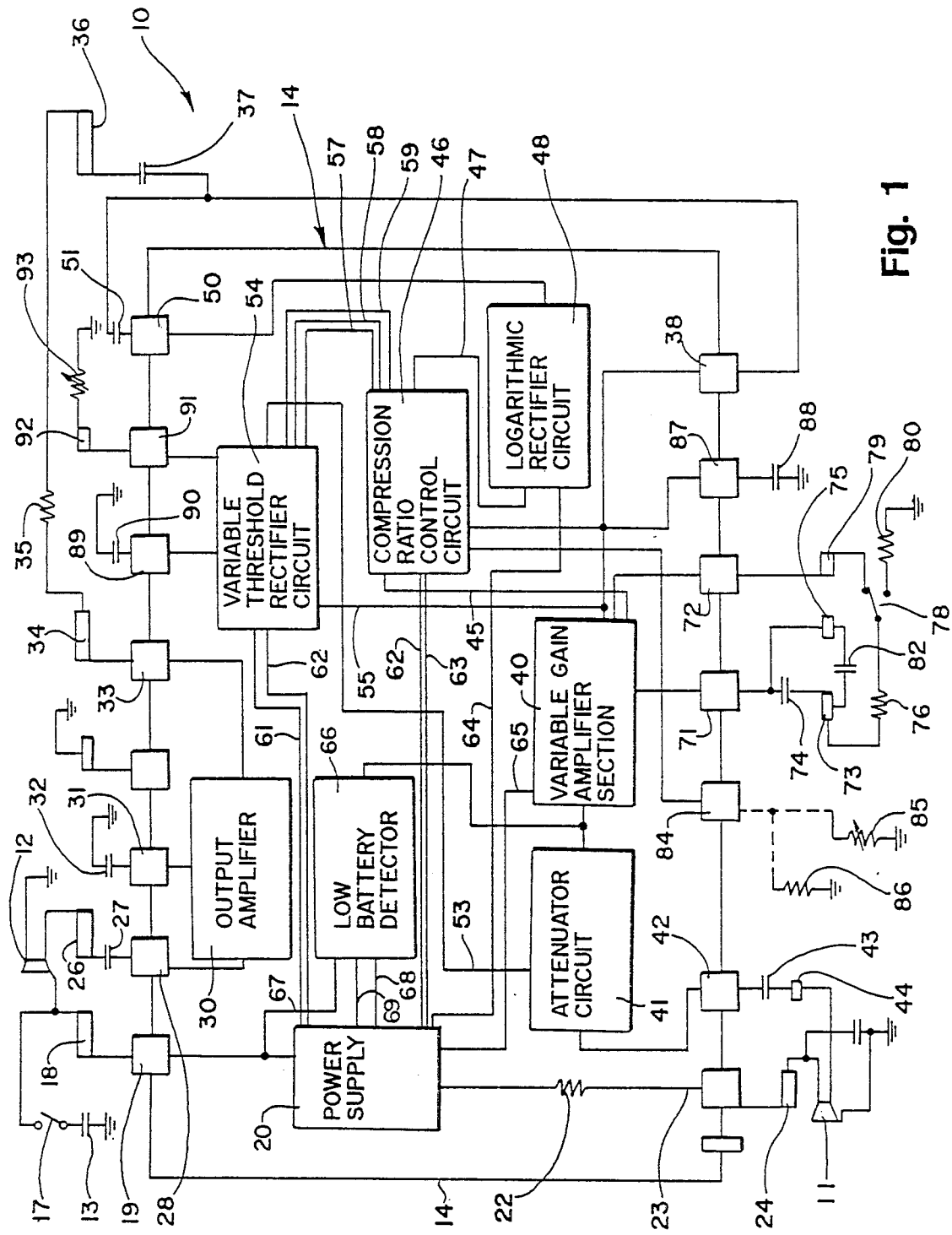
FIG. 1 is a schematic block diagram of a hearing aid constructed in accordance with the principles of the invention.
Figure 2:
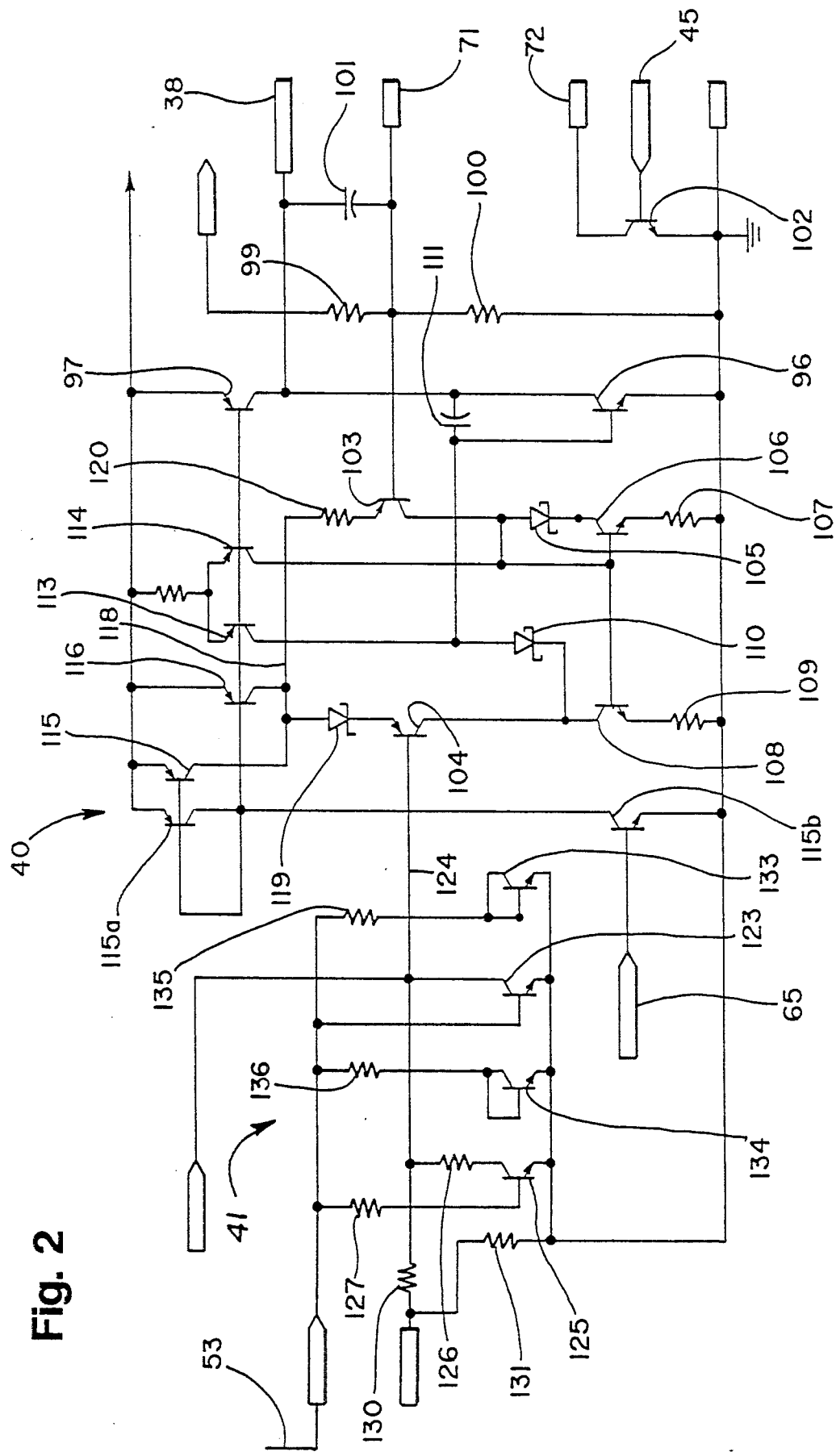
FIG. 2 is a schematic diagram of a variable gain amplifier section and of a variable attenuator circuit of the hearing aid of FIG. 1.

In FIG. 1, reference numeral 10 generally designates a hearing aid which is constructed in accordance with the principles of the invention. The hearing aid 10 includes a microphone 11, a receiver 12, a battery 13 and circuitry for amplifying signals from the microphone 11 and applying amplified signals to the receiver 12. In the illustrated arrangement, the circuitry includes components on an integrated circuit chip which is generally designated by reference numeral 14 and circuit components which are external to the chip 14 and which are adjustable or of selectable size and/or too large or otherwise such that it is not possible or desirable to include them on the chip 14. The external components include an on-off switch 17 connected between the positive terminal of battery 16 and an external "VBAT" terminal or pad 18. Pad 18 is connected through a chip terminal 19 to a power supply 20 which supplies various regulated voltages to circuits within the chip 15 and which is connected through a resistor 22 to a chip terminal 23 which is connected through a pad 24 to the microphone 11 to supply an operating voltage thereto. An optional external filter capacitor 25 may be connected between pad 24 and ground.

The receiver 12 is connected to the external "VBAT" terminal or pad 18 and to a "RCVR" pad 26 which is connected through a capacitor 27 and a chip terminal 28 to the output of an output amplifier 30. Output amplifier 30 is connected through a chip terminal 31 and an external capacitor 32 to ground, for control of its operation, and has an input connected through a chip terminal 33 to an external "AMPIN" pad 34. The pad 34 is connected through an external gain select resistor 35 to a "VGOUT" pad 36 which is connected through a capacitor 37 and a chip terminal 38 to the output of a variable gain amplifier section 40 within the chip 14. The input of the variable gain amplifier section 40 is connected to the output of a variable attenuator circuit 41 having a signal input connected to a chip terminal 42 which is connected through an external capacitor 43 and a pad 44 to the microphone 11.

It will be understood that as used herein, the term "VBAT" refers to a pad or terminal for connection to a battery, the term "RCVR" refers to a pad or terminal for connection to a receiver, the term "AMPIN" refers to a pad or terminal for connection to an input of an amplifier and the term "VGOUT" refers to a pad or terminal for connection to the output of the variable gain amplifier section 40.

Feedback circuitry is provided for supplying a control signal to the variable gain amplifier section 40 for control of its gain as a function of the amplitude of its output signal developed at the terminal 38. A gain control input of the amplifier section 40 is connected through a line 45 to the output of a compression ratio control circuit 46 which has an input connected through a line 47 to the output of a logarithmic rectifier circuit 48. A signal input of circuit 48 is connected to a chip terminal 50 which is connected through an external capacitor 51 and through the chip terminal 38 to the AC output of the variable gain amplifier section 40. The logarithmic rectifier circuit 48 includes an amplifier which develops an AC signal having a peak value which is a logarithmic function of the amplitude of the output of the variable gain amplifier section 40 and which is applied to a detector circuit of the compression ratio control circuit 46 to develop a DC signal which is applied through line 45 to the section 40 to control the gain thereof. The feedback circuitry is operable over a wide range with very low distortion and includes features such as to minimize current consumption and to reduce size and otherwise facilitate inclusion on an integrated circuit chip.

Important features of the circuitry relate to the variable attenuator circuit 41 and its control in response to the output of the variable gain amplifier section 40 to limit the output of the section 40 and the intensity of sound developed by the receiver 12 while producing very low distortion in the sound developed. The attenuator circuit 41 includes scaled transistor and current controlled rectifier circuitry which achieves low distortion over a very wide range. Reference is made to the aforementioned application of Mead C. Killion, and Donald W. Wilson being filed contemporaneoulsy herewith Ser. No. 07/431,540, entitled: VARIABLE ATTENUATOR CIRCUIT". For control of its operation, the attenuator circuit 41 is connected to through a line 53 to the output of a variable threshold rectifier circuit 54 which has a signal input connected through a line 55 to the output of the variable gain amplifier section 40. Circuit 54 responds rapidly to increases in the output of amplifier 40 above a certain level and applies a control signal to the attenuator circuit 41 to effect a corresponding rapid reduction in the signal input to the amplifier section 40.

The variable threshold rectifier circuit 54 also includes circuits which supply biasing or control voltages through lines 57, 58 and 59 to the compression ratio control circuit 46. Biasing and control signals are received by the variable threshold rectifier circuit 54 through lines 61 and 62 connected to the power supply circuit 20, which also applies biasing and control voltages to the logarithmic rectifier circuit 48, through lines 62, 63 and 64, and to the variable gain amplifier section 40 through line 65.

A low battery detector circuit 66 is provided which is connected through a line 67 and the chip terminal 19 to the battery terminal 18. Reference is made to the aforementioned application of Mead C. Killion, Ser. No. 07/414,903, filed Sep. 29, 1989 and entitled: "LOW BATTERY DETECTOR AND INDICATOR" and to the aforementioned application of Mead C. Killion, Ser. No. 07/416,703, filed Oct. 3, 1989 and entitled: "HEARING AID WITH AUDIBLE ALARM".

The power supply circuit 20 supplies a regulated voltage to the detector circuit 66 through a line 68 also supplies a voltage through a line 69 which varies as a function of the battery voltage. When the battery voltage drops below a certain threshold level, the detector circuit 66 develops an output signal which is applied through a line 70 to the input of the variable gain amplifier section 40. Initially, the signal is of very low amplitude and frequency and may be inaudible or substantially so. As the battery voltage continues to drop below the threshold level, the signal applied from the low battery detector circuit 66 increases in amplitude and frequency becoming more and more audible and increasing intensity as the battery voltage drops to provide the user with an advance knowledge that the battery will need to be replaced and with the increasing urgency of doing so.

For control of its operation, the variable gain amplifier section 40 is connected to two chip terminals 71 and 72 which are connectable to external components. Terminal 71 is connected to a pad 73 through a capacitor 74 and is connected directly to another pad 75. As shown, terminal 73 is connectable through an adjustable gain control resistor 76 to a selector switch 78 for connection either through a pad 79 to the chip terminal 72 to obtain dynamically controlled compression or through a resistor 80 to ground to obtain a linear response characteristic. A capacitor 82 is optionally connectable between the terminals 73 and 75.

For control of the operation of the compression ratio control circuit 46, it is connected to a pad 84 which is connectable through either an adjustable external resistor 85 or a fixed resistor 86 to ground and it is also connected to a pad 87 which is connected through an external capacitor 88 to ground.

The variable threshold rectifier circuit 54 is connected to a chip terminal 89 which is connected through an external capacitor 90 to ground and is also connected through a chip terminal 91 to a pad 92 which is connectable through an optional variable resistor 93 to ground.

VARIABLE GAIN AMPLIFIER SECTION 40 (FIG. 2)

The variable gain amplifier section 40 comprises an output stage formed by a transistor 96 having a grounded emitter and having a collector connected to the chip output terminal 38 and also through a current source which includes a transistor 97. A pair of resistors 99 and 100 are connected between output terminal 38 and ground and a capacitor 101 is connected in parallel relation to the upper resistor 99. The junction between resistors 99 and 100 is connected to the chip terminal 71 which, as shown in FIG. 1, may be connected through the external capacitor 74 and the sensitivity control resistor 76 to the terminal 72 or through a resistor 79 to ground, depending upon the position of the selector switch 78. The terminal 72 is connected to the collector of a transistor 102 which has a grounded emitter and which has a base connected through the line 45 to the output of the compression ratio circuit 46.

Thus, when the selector switch 78 is positioned as shown in FIG. 1, the transistor 102 and the capacitor 74 and variable resistor 78 in series therewith are connected in shunt relation to the lower resistor 100. The proportion of the output voltage developed across the resistor 100 is thus controllable from the compression ratio control circuit and is a function of frequency, affected by the value of the capacitor 74 and the combined value of the resistor 76 and the collector resistance of transistor 102 acting as a current-controlled variable resistor. This voltage across resistor 100 is used as a feedback voltage in the variable gain amplifier section, the junction between resistors 99 and 100 being applied to the base of a transistor 103 of a differential amplifier circuit which includes a second transistor 104, the base of which is connected to the input of the variable gain amplifier circuit 40.

The collector of transistor 103 is connected through a Schottky diode 105 and through a transistor 106 and a resistor 107 to ground. The collector of the transistor 104 is connected through a transistor 108 and a resistor 109 to ground and is also connected through a Schottky diode 110 to the base of the output transistor 96, a capacitor 111 being connected between the base and collector electrodes of the transistor 96.

A current source which includes a transistor 113 is connected to the anode of the Schottky diode 110 and another current source formed by a transistor 114 is connected to the anode of the Schottky diode 105. An additional current source which includes transistors 115 and 116 is connected to a circuit 118 which is connected through a Schottky diode 119 to the emitter of transistor 104 and through a resistor 120 to the emitter of transistor 103.

In the operation of the circuit, the Schottky diode 119 produces an offset such that the input signal applied to the base of the transistor 104 may vary above and below ground potential, i.e., with ground as a reference. The transistors 106 and 108 operate as current mirrors and the Schottky diodes 105 and 110 provide offsets in compensating relation to each other and to the offset provided by the Schottky diode 119. The resistor 120 has a resistance which is approximately the same as the AC impedance of the Schottky diode 119, so as to obtain balanced operation.

The base of transistor 115 is connected to the base and collector of transistor 115a acting as a current mirror. The base of transistor 115a is connected to transistor 115b acting as a current source and having a base connected through the bias line 65 to power supply 20.

VARIABLE ATTENUATOR CIRCUIT 41 (FIG. 2)

Reference is again made to the aforementioned application of Mead C. Killion, and Donald W. Wilson being filed contemporaneoulsy herewith Ser. No. 07/431,540, entitled: "VARIABLE ATTENUATOR CIRCUIT", in which the variable attenuator circuit 41 and its construction and operation, as well as modifications thereof, are disclosed in detail. As aforementioned, the disclosure of said application is incorporated by reference.

In a preferred embodiment, a current controlled resistor means is provided which includes a transistor 123 having a grounded emitter and having a collector which is connected to a line 124 which forms an output line connected to the input 41 of an amplifier circuit 40. The base of transistor 123 is connected to the output line 53 of the control signal source 54, which in the preferred embodiment includes a high output-impedance source of control current, conduction of the transistor 123 being thereby controlled by the control current from the circuit 54.

A second transistor 125 has a grounded emitter and has a collector connected through a resistor 126 to the line 124, the base of transistor 125 being connected through a resistor 127 to the line 53. The conduction of the transistor 125 is thereby also controlled from the output of the control current source 54 but with a different response characteristic. Also, the transistor 125 has characteristics different from those of the characteristics of transistor 123.

In a preferred embodiment, the effective area of the transistor 125 is ten times that of the transistor 123. Line 124 is connected through a resistor 130 to the terminal 42 which is connected to an input signal source 20.

In the operation of the circuit as thus far described, a voltage-divider action is obtained, the output signal at line 124 being a certain fraction of the input signal voltage, depending upon the ratio of the impedance provided by the transistors 123 and 125 and resistor 126 to the total impedance, including that of resistor 130 and the effective internal impedance of the signal source 20.

As the control current applied through line 53 from the control signal source increases, the effective impedance between line 124 and ground drops thereby increasing the attenuation of the input signal. With the two transistors 123 and 125 and resistors 126 and 127 as shown, and with the proper characteristics of the transistors 123 and 125, a scaling action is obtained such as to improve the linearity of response over a wide dynamic range.

It is found, however, that the response is not completely linear with only the transistors 123 and 125 and associated resistors 126 and 127 and that substantially improved results are obtained through the addition of at least one and preferably two transistors 133 and 134 as shown, having bases and collectors connected together to operate as diodes and being connected through resistors 135 and 136 to the control current line 53. Transistor 134 can advantageously have a larger area than transistor 133, by a factor of $3\times$ in the preferred embodiment.

The operation of current controlled resistor means is described in more detail in the aforementioned application which shows the progression of circuit design from a single transistor circuit to the current-controlled resistor means illustrated herein and in which output voltage versus input voltage graphs for each circuit indicate the increasingly linear response of each circuit.

COMPRESSION RATIO CONTROL CIRCUIT 46 (FIG. 3)

The compression ratio control circuit 46 includes a DC amplifier having an input connected to the output of a detector circuit which operates to detect the negative peak value of an AC output signal from the logarithmic rectifier circuit 48. An important feature is that the input of the DC amplifier is also connected through the external compression ratio control resistor 85 to ground with the circuitry being such that the amount of compression is increased in proportion to the resistance of the resistor 85. Additional features relate to the achievement of proper operation at a low supply voltage and with low current consumption, including an arrangement which provides a level shift between the AC output of the logarithmic rectier circuit 48 and the detector circuit.

In the compression ratio control circuit 46, the output line 45 is connected to the collector portions of two transistors 141 and 142 which have emitters connected to the chip terminal 19 to be supplied with battery voltage. The transistors 141 and 142 operate as a $5\times$ current multiplier, one collector portion of transistor 142 being connected to the base thereof as shown and being connected in series with a resistor 143 and a control transistor 144 to ground.

The base of the control transistor 144 is connected to the collector of a transistor 146, the base of which is connected through a transistor 147 to ground. A resistor arrangement, including three resistors 149, 150 and 151 in series is provided with three parallel shunts 152, 153 and 154, the shunts being selectively removable to obtain any one of a number of possible resistances in the circuit. The base of the transistor 147 is connected to the collector of a transistor 156 which has its emitter connected to the emitter of transistor 146 and to a current source which includes transistor 157 and which is controlled through the line 57 from circuitry within the variable threshold rectifier circuit 54. Another current source is provided by a transistor 158 which is connected through a line 58 to the variable threshold rectifier circuit 54.

The base of the transistor 156 is connected to a transistor 160 operative as a current source and having a base connected through the line 59 to the variable threshold rectifier circuit 54. The base of transistor 156 is also connected to two transistors 161 and 162, both operative as diodes with collector and base electrodes thereof connected to each other. The emitter of the transistor 161 is connected to the line 63 to be supplied with a reference voltage from the power supply circuit 20, for example, a reference voltage of 0.17 volts. The emitter of the transistor 162 is connected to the chip terminal 84 to be connected to ground either to the variable resistor 85 or the fixed resistor 86.

The emitter of transistor 162 is also connected through a resistor 163 to a circuit point 164 which is connected through a resistor 165 to ground and also to the collector of a transistor 167 and the emitter of a transistor 168. Transistors 167 and 168 operate to provide a level-shift DC amplifier with extremely high input impedance. The base of the transistor 167 and the collector of the transistor 168 are connected together and to a current source which is provided by a transistor 170 having a base connected through the line 58 to the variable threshold rectifier circuit 54. The base of the transistor 168 is connected to the chip terminal 87 to be connected through capacitor 88 to ground and is also connected to a transistor 172 and to the collectors and bases of a pair of transistors 173 and 174. The transistor 172 operates as a current source and its base electrode is connected through the line 59 to the variable threshold rectifier circuit 54. The emitters of the transistors 173 and 174 are connected together and through line 47 to the output of the logarithmic rectifier circuit 47.

Figure 3:
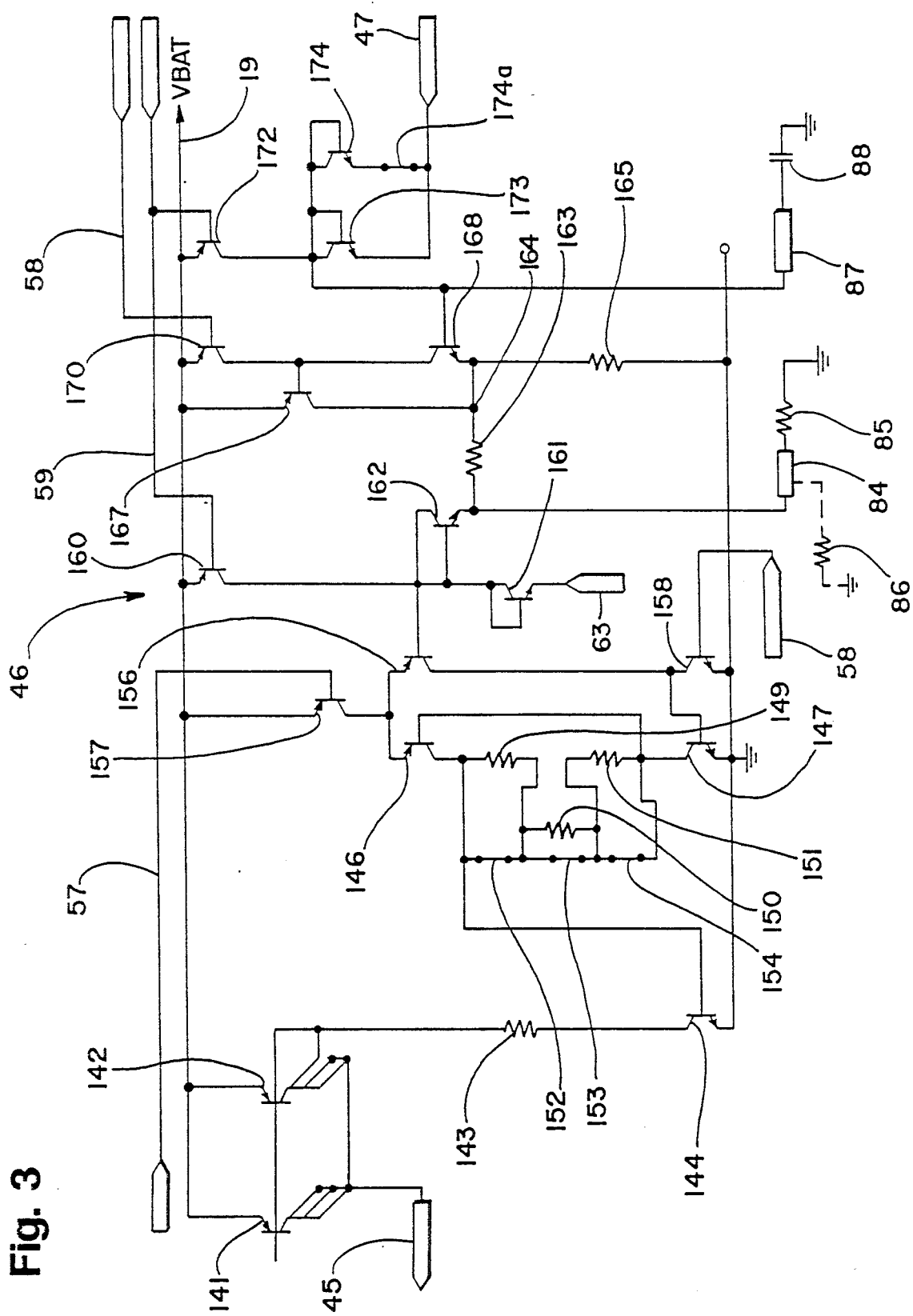
FIG. 3 is a schematic diagram of a compression ratio control circuit of the hearing aid of FIG. 1.
Figure 4:
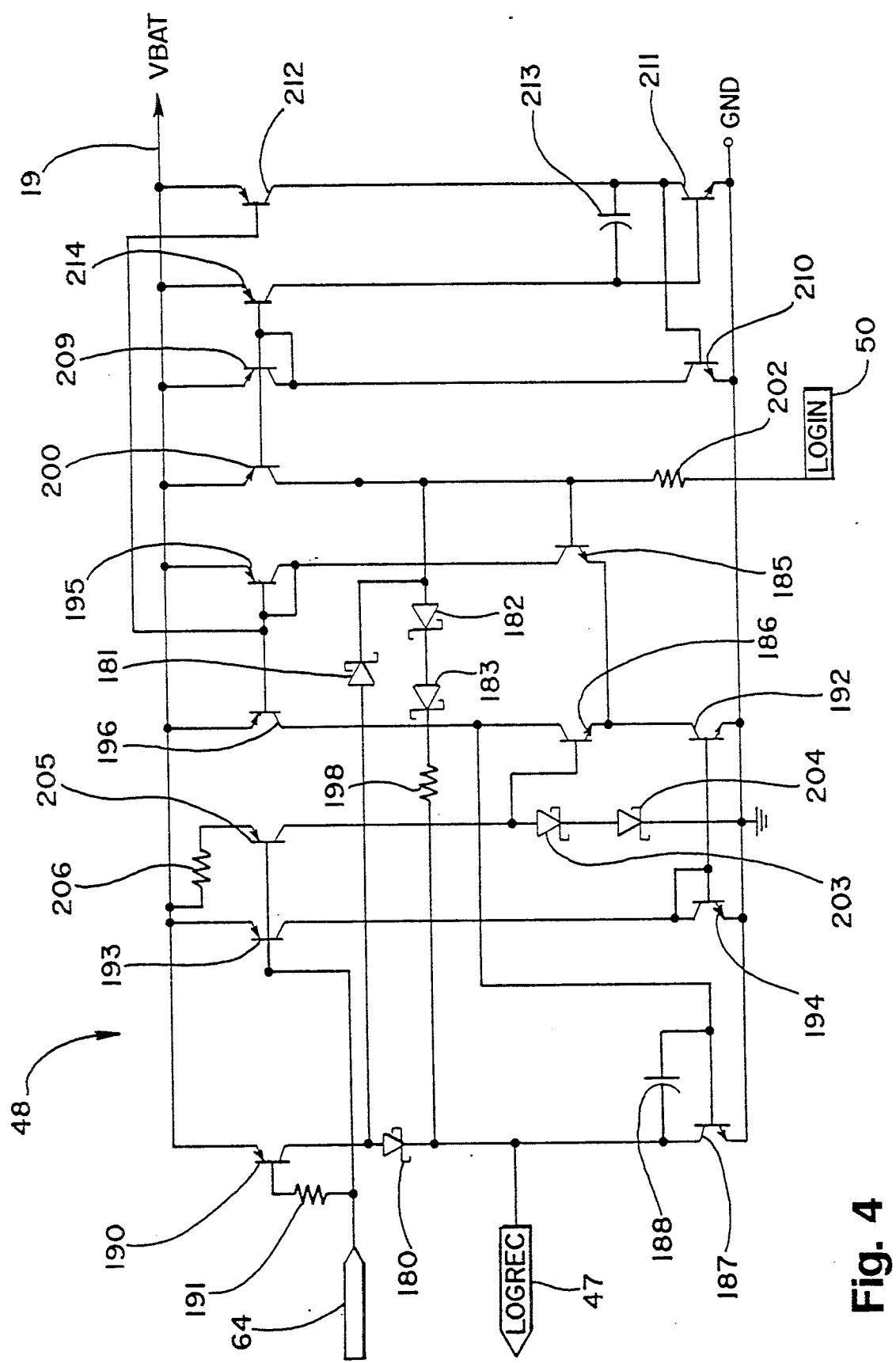
FIG. 4 is a schematic diagram of a logarithmic rectifier circuit of the hearing aid of FIG. 1.
Figure 5:
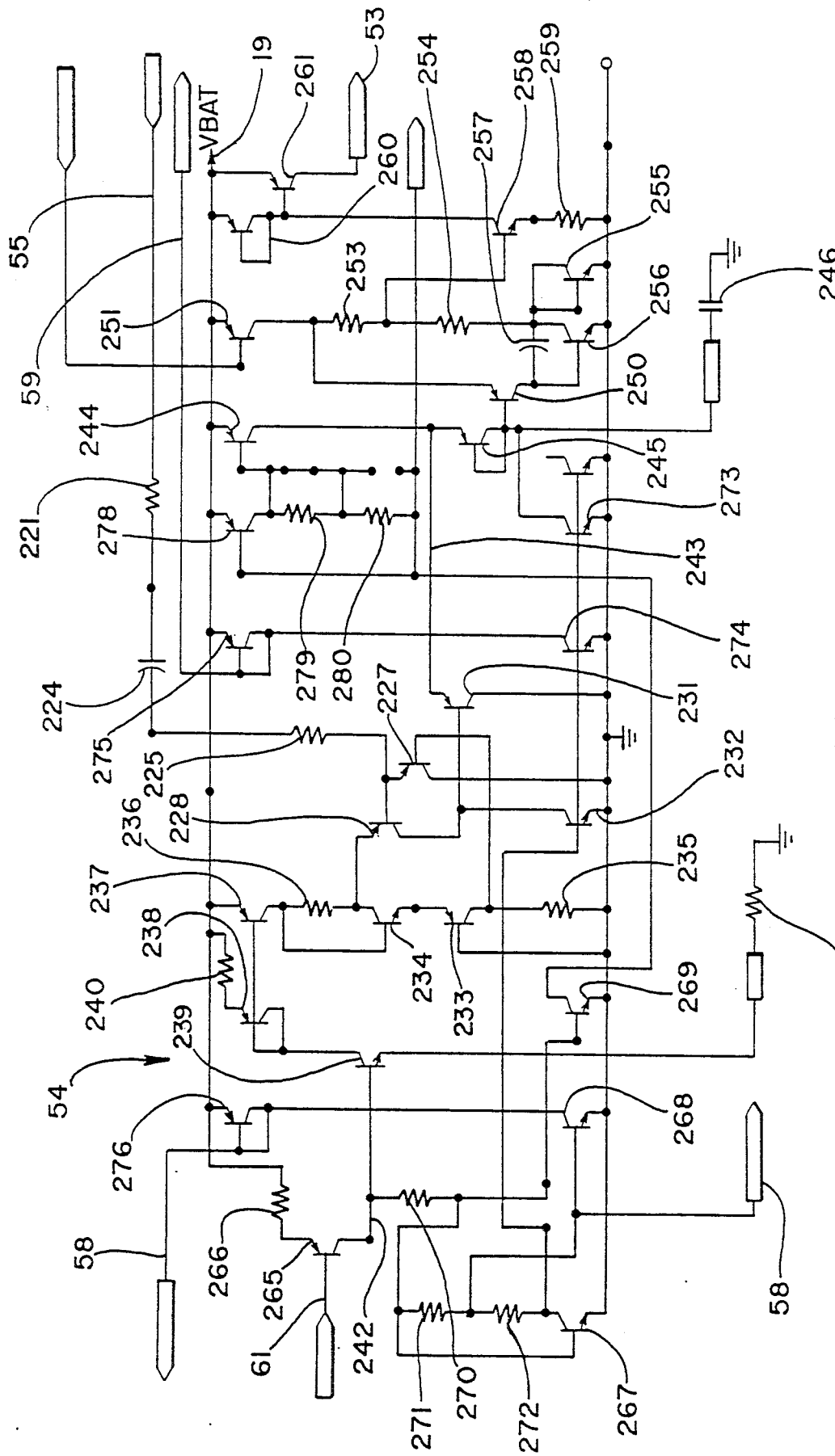
FIG. 5 is a schematic diagram of a variable threshold rectifier circuit of the hearing aid of FIG. 1.

In operation, the negative peaks of signals supplied by the logarithmic rectifier 48 on its output line 47 act to discharge capacitor 88 through transistors 173 and 174 acting as a rectifier similar to the action of transistor Q8 in FIG. 3 of the aforementioned U.S. Pat. No. 4,170,720. Parallel transistors 173 and 174 are preferably each 8× size, providing a 72 mV DC level shift relative to transistor 168, which is preferably a 1× device. In this manner, an improved operation over that described in aforementioned U.S. Pat. No. 4,170,720 is obtained, because the upper threshold of the compression action (point C on the curve labeled "DESIRED CHARACTERISTIC" in FIG. 4 of that patent) now corresponds to a DC level of approximately 0 volts at chip terminal 84, so that changes in compression ratio can be accomplished by choice of value for attenuating resistor 85 without affecting the desired location of the upper threshold of compression along the input-output characteristic. Alternately, by removing jumper 174a, and some or all of jumpers 152, 153, and 154, a circuit action will be obtained in which both the upper threshold of compression and the compression ratio will covary with resistance 85, a circuit action which may be desireable in some applications; for example, for a single hearing aid designed to be adjustable to accomade for both mild and severe hearing losses.

LOGARITHMIC RECTIFIER CIRCUIT 48 (FIG. 4)

The logarithmic rectifier circuit 48 includes a Schottky diode 180 which operates in conjunction with Schottky diodes 181, 182 and 183 and amplifier circuitry including transistors 185, 186 and 187 in providing a logarithmic response characteristic over a wide dynamic range, as described in column 7, lines 12-21 and lines 51-57 of the aforementioned U.S. Pat. No. 4,170,720 patent, but with a relatively low voltage swing at the output at the highest signal levels, thus reducing the required amplifier gain. The circuit also includes an input bias concellation arrangement.

In the amplifier circuitry, the transistors 185 and 186 operate as a differential amplifier and the transistor 187 operates as an output stage. It has a grounded emitter, a base connected to the collector of transistor 186 and through a capacitor 188 to its collector which is connected to the output line 47 and through Schottky diode 180 and a transistor 190 to the "VBAT" terminal 19. The transistor 190 operates as a current source, its base being connected through a resistor 191 and through line 64 to a source of bias potential provided by the power supply circuit 20.

The differential amplifier transistors 185 and 186 have emitters connected to ground through a common transistor 192 which has a base connected to the "VBAT" chip terminal 19 through a transistor 193 and connected to ground through a transistor 194 which has base and collector electrodes tied together to operate as a diode. The collectors of the differential amplifier transistors 185 and 186 are connected to the "VBAT" chip terminal 19 through transistors 195 and 196, the base and collector electrodes of the transistor 195 being connected together and to the base of the transistor 196. The transistor 195 thus operates as a diode. Current flow through the transistor 196 and also through the transistor 186 is controlled as a function of current flow through the transistors 195 and 185.

As shown, the Schottky diodes 181, 182 and 183 are connected in series with a resistor 198 between the anode and cathode of the Schottky diode 180. The base of the differential amplifier transistor 185 is connected to the junction between the Schottky diodes 181 and 182, through a transistor 200 to the "VBAT" terminal 19 and through a resistor 202 to the chip terminal 50 to receive an input signal from the output of the variable gain amplifier circuit 40. The base of the other differential transistor 186 is connected through a pair of Schottky diodes 203 and 204 to ground and also through a transistor 205 and a resistor 206 to the "VBAT" terminal 19, the base of the transistor 205 being connected to the bias line 64 to develop a substantially constant current flow through transistor 205.

The Schottky diode 180 provides a voltage offset which may be on the order of 0.4, for example. It operates in conjunction with the Schottky diodes 181, 182 and 183 in providing a feedback signal such as to obtain a logarithmic response characteristic but with low voltage swings being required. The voltage drop across the diode 180 operates to offset the voltage drops across the diode 181 and one of the diodes 182 and 183. Diodes 203 and 204 offset the effects of diodes 182 and 183 to balance the operation of the operational amplifier formed by transistors 185 and 186.

The transistor 200 is operative in conjunction with an input bias cancellation feature which is such as to supply at least a major portion of a biasing current applied to the base of the input transistor 185 to reduce biasing current required from the feedback diodes 181, 182 and 183. In the illustrated arrangement, a transistorized circuit is provided which responds to the collector current of transistor 185 and, through transistor 200, supplies a biasing current which corresponds closely to the current flow into the base of the input transistor 185. The base of transistor 200 is connected to both the base and collector of a transistor 209 and also to the collector of a transistor 210, the emitter of transistor 209 being connected to the "VBAT" terminal 19 and the emitter of transistor 210 being connected to ground. The current flow through transistor 200 is thereby controlled by the current flow through transistor 210. The base of transistor 210 is connected to the collector of a transistor 211 and also to the collector of the transistor 212, the emitter of transistor 211 being connected to ground and the emitter of transistor 212 being connected to the "VBAT" terminal 19.

The base of transistor 211 is connected through a capacitor 213 to its collector and is also connected to the collector of a transistor 214 which has its emitter connected to the "VBAT" terminal 19 and which has its base connected to the collectors of transistors 209 and 210 as well as to the bases of transistors 209 and 200.

In operation, the current flow through transistor 212 is controlled by the current flow through transistors 195 and 196 to control current flow through the transistor 210 which, in turn, controls current flow to the transistor 200, and the transistor 214 operates to maintain a current flow through transistor 211 corresponding to that through the transistor 212. The overall result is that the current through the transistor 211 corresponds to the current flow through the transistor 185, and the current flow through transistor 200 corresponds closely to current flow into the base of transistor 185.

VARIABLE THRESHOLD RECTIFIER CIRCUIT 54 (FIG. 5)

As aforementioned, the variable threshold rectifier circuit 54 responds rapidly to increases in the output of the variable gain amplifier section 40 above a certain selectable level to apply a control signal to the attenuator circuit 41 and to effect a correspondingly rapid reduction in the signal input to the amplifier section 40.

Important features of the circuit 54 relate to circuitry such that the required signal levels are of quite low magnitude so that the operation is accomplished with a low supply voltage and with very low currents. The circuitry has excellent temperature compensation characteristics and is readily controllable with a linear relationship between the threshold level expressed in decibels and resistance of a control resistance 220 which is connected to ground.

The input signal applied from the output of amplifier section 40 through the line 55 is applied through a series resistor 221 and a capacitor 224 and a resistor 225 to the emitter of a transistor 227 and the base of a transistor 228. The transistors 227 and 228 operate in a manner analogous to the operation of two diodes in a voltage-doubler rectifier circuit. During positive half cycles of the input signal applied through resistor 221, capacitor 224 and resistor 225, there is conduction through the emitter-base junction of transistor 227. During negative half cycles, there is conduction through the emitter-base junction of transistor 228.

However, and unlike the operation of a conventional two diode voltage doubler, the current flows through the transistors 227 and 228 are controlled in a manner such as to require very low currents and thereby very low input signal levels. As shown, the collector of transistor 227 is connected to ground while the collector of transistor 228 is connected to the base of a transistor 231 and through a transistor 232 to ground. Transistor 231 operates to allow development of an output signal at input signal levels above a certain threshold value. Transistor 232 operates in performing a logic function, supplying a bias current to the base of the transistor 231 to be overcome before an output signal is developed.

To control the threshold level and also to minimize the required current levels and to achieve temperature compensation, the base of the transistor 227 and the emitter of the transistor 278 are connected to the collector of a PNP transistor 233 and the collector of an NPN transistor 234, the emitters of transistors 233 and 234 being tied together. The collector of transistor 233 is connected through a resistor 235 to its base and to ground while the collector of transistor 234 is connected through a resistor 236 to its base and through a transistor 237 to the "VBAT" terminal 19.

The transistors 233 and 234 have relatively large areas as compared to the areas of the transistors 227 and 228 and they operate to allow the transistors 227 and 228 to respond to the positive and negative peaks of an input signal at very low current levels. They also operate to provide temperature compensation which is quite important in view of the very high sensitivity achieved with the circuit.

In addition, the current flow through transistors 233 and 234 may be controlled through control of the transistor 237, to control the threshold level at which the transistor 231 becomes operative. The base of transistor 237 is connected to the collector and base electrodes of a transistor 238, and also to the collector of a transistor 239. The emitter of transistor 238 is connected through a resistor 240 to the "VBAT" terminal 19. The base of transistor 239 is connected to a line 242 to which a bias voltage is applied as hereinafter described while the emitter is connected through the resistor 220 which controls the threshold level at which the limiting action is obtained. The arrangement is advantageous in that the threshold level is controllable through a simple resistance to ground and is also advantageous in that the attenuation in decibels is a linear function of the value of the resistance.

In this circuit, transistors 233, 234 and 237 cooperate to develop two different reference potentials at first and second circuit points at the collectors of the transistors 233 and 234. The base-emitter junctions of transistors 227 and 228 are connected between such first and second circuit points and a third circuit point which is connected to the emitter of transistor 227 and the base of transistor 228 and which is connected to the variable gain amplifier section 40 through coupling means including the resistor 225, capacitor 224 and resistor 221. The charge of the capacitor 224 is changed in one direction through current flow through one of such semiconductor junctions during half cycles of an applied signal of one polarity and is changed in an opposite direction through current flow through the other of such semi-conductor junctions during half cycles of an applied signal of an opposite polarity. As aforementioned, transistor 231 operates to allow development of an output signal at input signal levels above a certain threshold value. Transistor 237 controls current flow through the transistors 233 and 234 to control the reference potentials at the aforementioned first and second circuit points and thereby control the signal level above which the output signal is developed.

For development of the output signal, the collector of the transistor 231 is connected to ground while its emitter is connected to a circuit point 243 which is connected through a transistor 244 operative as a current source and which is connected through a transistor 245 and a capacitor 246 to ground. In normal operation, when signal levels are below a threshold value, the transistor 231 is conductive to prevent any substantial charging of the capacitor 246. When the signal levels exceed the threshold level, the capacitor 246 is allowed to charge through the current source provided by the transistor 244.

A complementary Darlington circuit with a DC offset is provided for developing the output signal on line 53 as a function of the voltage across the capacitor 246. This circuit includes a transistor 250, the emitter of which is connected through a current-source transistor 251 to the "VBAT" terminal 19. The emitter of transistor 250 is also connected through resistors 253 and 254 to the collector and base electrodes of a transistor 255 and to the collector electrode of a transistor 256, the base of transistor 256 being connected through a capacitor 257 to its collector and being also connected to the collector of transistor 250. The junction between resistors 253 and 254 is connected to the base of a transistor 258, the emitter of which is connected through a resistor 259 to ground. The collector of transistor 258 is connected to the collector and base electrodes of a transistor 260, the emitter of which is connected to the "VBAT" terminal 19.

Finally, the collector of transistor 258 is connected to the base of an output transistor 261, the emitter of which is connected to the "VBAT" terminal 19 while the collector thereof is connected to the output line 53.

For supply of a biasing voltage to the line 242, it is connected to the collector of a transistor 265, the emitter of which is connected through a resistor 266 to the "VBAT" terminal 19, the base of the transistor 265 being connected through the line 61 to the power supply circuit 20, to receive a bias voltage therefrom. Line 242 is also connected to a biasing arrangement including transistors 267, 268 and 269 and resistors 270, 271 and 272, connected as shown. The collector of transistor 267 is connected to the base of the transistor 232, and also to the bases of transistors 273 and 274, with transistor 273 being connected in parallel relation to the capacitor 246.

The transistor 274 is connected to the base and collector electrodes of a transistor 275 and also to the line 59, for supply of a bias voltage to transistors 160 and 172 of the compression ratio control circuit 46. Transistor 268 is connected through a transistor 276 to the "VBAT" terminal 19 and also to the line 58 for supply of a bias voltage to the transistor 160 of the compression ratio control circuit 46.

Transistor 269 is connected to a transistor 278 which is used in conjunction with resistors 279 and 280 for control of the transistor 244 and to control the charging current applied to the capacitor 246 when the control transistor 231 is non-conductive.

Figure 6:
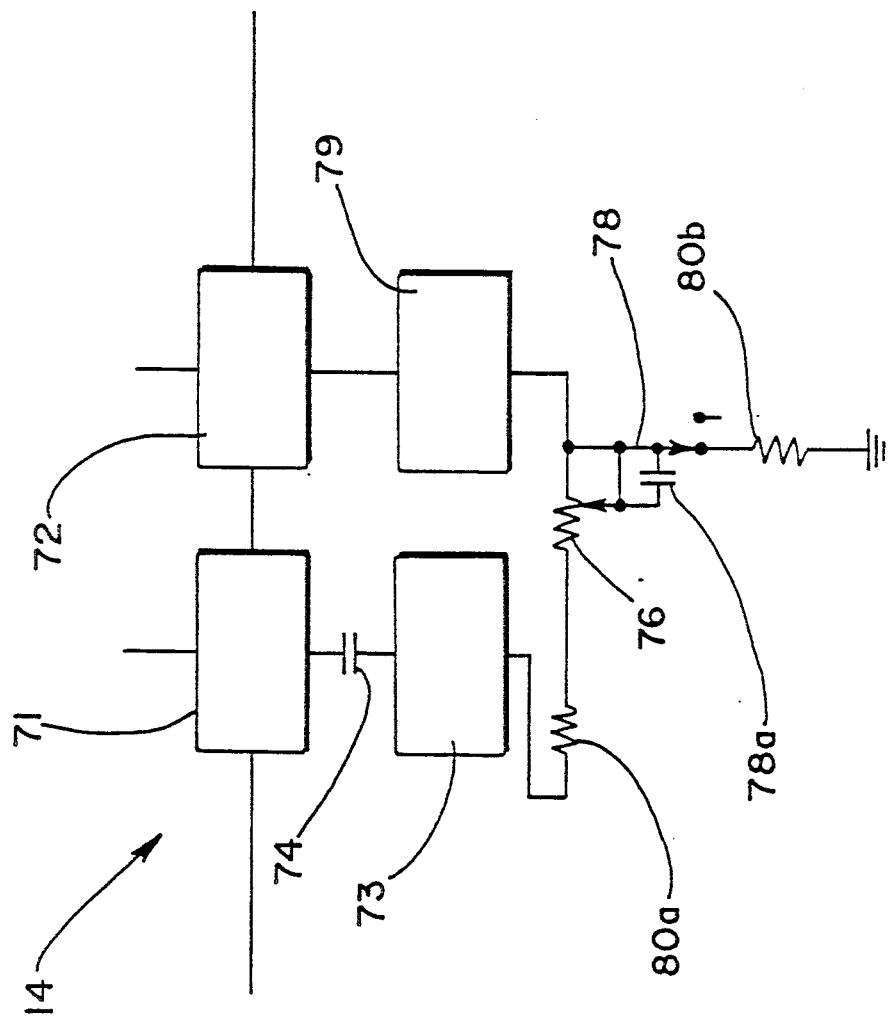
FIG. 6 is a schematic diagram showing a modified arrangement for manual control of gain and compression.

FIG. 6 shows a modified circuit arrangement in which adjustable resistance 76 is connected at one end to terminal 79 and has its opposite end connected through a gain limiting resistor 80a to the terminal 73. As diagrammatically indicated by its shape as illustrated, the resistance of resistor 76 is a non-linear function of movement of its movable contact from left to right, as is generally known as a "reverse log" function, with switch 78 actuated to provide an open circuit at the extreme of the slowly-changing resistance end of the movement of the movable contact, but with switch 78 otherwise acting as a closed circuit shorting chip terminal 79 thru gain limiting resistor 80b to ground. In operation, hearing aid 10 functions as a conventional linear hearing aid over nearly the entire travel of resistor 76, which acts as a volume control, with maximum gain occurring as the resistance approaches its minimum at the slowly-changing resistance end of the movement of the movable contact. Further movement opens switch contact 78, whereupon the hearing aid functions as a compression hearing aid as described herein. By this means, a single volume-control-plus-switch control provides both the volume control action for a linear hearing aid function as well as the logic for a linear-compression switching function.

It will be understood that modifications and variations may be effected without departing from the spirit and scope of the novel concepts of this invention.

We claim:

1. A hearing aid including microphone means for developing an input electrical signal in response to an applied audio signal, receiver means for developing an audio output signal in response to an applied electrical signal, a battery, and amplifier means arranged for energization from said battery and for receiving said input electrical signal from said microphone means and applying a corresponding output signal to said receiver means, said amplifier means comprising: an integrated circuit chip, a variable gain amplifier system including transistors on said integrated circuit chip and having an input responsive to said input electrical signal, a signal output and a gain control input, and a gain control circuitry including transistors on said integrated circuit chip, said gain control circuitry having logarithmic response characteristics and being arranged to apply a control signal to said gain control input of said variable gain amplifier system to control gain as a logarithmic function of signal level, said transistors of said gain control circuitry on said integrated circuit chip including an input transistor having a base electrode, feedback diode means for applying a feedback signal to said base electrode, and bias current reduction means on said integrated circuit chip and separate from said feedback diode means, said bias current reduction means including a transistor connected to said base electrode of said input transistor for applying to said base electrode a biasing current which corresponds closely to current flow into said base electrode of said input transistor in order to reduce biasing current required from said feedback diode means.

2. A hearing aid as defined in claim 1, wherein said gain control circuitry includes logarithmic rectifier means including transistors on said integrated circuit chip and having a logarithmic response characteristic such as to develop an output signal having a peak value varying as a logarithmic function of a signal at the output of said variable gain amplifier system, and a compression ratio control circuit also including transistors on said integrated circuit chip and arranged to respond to said peak value of said output signal of said logarithmic rectifier means and to apply a corresponding gain control signal to said gain control input of said variable gain amplifier system.

3. A hearing aid as defined in claim 2, wherein said logarithmic rectifier means includes said input transistor and additional transistors forming an amplifier having an input and an output, said feedback diode means on said integrated circuit chip being coupled between said input and said output of said amplifier of said logarithmic rectifier means, and said feedback diode means having a non-linear characteristic to obtain a feedback signal such as to obtain said logarithmic response characteristic.

4. A hearing aid as defined in claim 3, wherein said amplifier of said logarithmic amplifier means includes an output transistor, a current source for said output transistor, and offset diode means coupled to said feedback diode means and coupled between said current source and said output transistor.

5. A hearing aid as defined in claim 4, wherein said feedback diode means includes a diode coupled between said input of said amplifier and one end of said offset diode means and an oppositely poled diode coupled between said input of said amplifier and an opposite end of said offset diode means.

6. A hearing aid as defined in claim 1, said gain control circuitry providing a level dependent frequency response characteristic such as operate at low input signal levels to increase gain at higher signal frequencies relative to gain at lower signal frequencies, wherein said variable gain amplifier system includes a variable resistance having a resistance controlled by said control signal applied to said gain control input and a reactive impedance connected with said variable resistance to provide a gain control impedance which controls the gain of said variable gain amplifier system as a function of the value of said variable resistance and the frequency of a signal to be amplified.

7. A hearing aid as defined in claim 6, wherein said amplifier system includes an-an amplifier having an input and an output, and a feedback, circuit including said gain control impedance connected between said output and said input.

8. A hearing aid as defined in claim 7, wherein said feedback circuit includes a resistance connected in series with said gain control impedance to said output of said amplifier, and a feedback coupling between said input of said amplifier and a point between said resistance and said gain control impedance.

9. A hearing aid as defined in claim 8, wherein said reactive impedance includes a capacitor connected in series with said variable resistance.

10. A hearing aid as defined in claim 2, wherein said compression ratio control circuit includes a capacitor, means responsive to said output signal from said logarithmic rectifier circuit to charge said capacitor to a value corresponding to said peak value of said output signal, and DC amplifier means for responding to the voltage of said capacitor to develop a gain control signal for application to said gain control input of said variable gain amplifier system.

11. A hearing aid as defined in claim 10 wherein said DC amplifier means includes a transistor having a base electrode connected to said capacitor and wherein said compression ratio control circuit includes means for applying a current to said capacitor to charge said capacitor in one direction and to apply a biasing current to said base electrode of said transistor of said DC amplifier means, and detector diode means coupling said output signal from said logarithmic rectifier circuit to said capacitor to charge said capacitor in an opposite direction in response to said peak value of said output signal and to provide a level shift between said base electrode of said transistor of said DC amplifier means and said output of said logarithmic rectifier means.

12. A hearing aid as defined in claim 10, wherein said DC amplifier means includes an adjustable compression ratio control resistor connected to ground and operative to control the DC gain of said amplifier.

13. An amplifier comprising: an integrated circuit chip, a variable gain amplifier system including transistors on said integrated circuit chip and having a signal input, a signal output and a gain control input, and a gain control circuitry including transistors on said integrated circuit chip, said gain control circuitry having logarithmic response characteristics and being arranged to apply a control signal to said gain control input of said variable gain amplifier system to control gain as a logarithmic function of signal level, said transistors of said gain control circuitry on said integrated circuit chip including an input transistor having a base electrode, feedback diode means for applying a feedback signal to said base electrode, and bias current reduction means on said integrated circuit chip and separate from said feedback diode means, said bias current reduction means including a transistor connected to said base electrode of said input transistor for applying to said base electrode a biasing current which corresponds closely to current flow into said base electrode of said input transistor in order to reduce biasing current required from said feedback diode means.

14. An amplifier as defined in claim 13, wherein said gain control circuitry includes logarithmic rectifier means including transistors on said integrated circuit chip and having a logarithmic response characteristic such as to develop an output signal having a peak value varying as a logarithmic function of a signal at the output of said variable gain amplifier system, and a compression ratio control circuit also including transistors on said integrated circuit chip and arranged to respond to said peak value of said output signal of said logarithmic rectifier means and to apply a corresponding gain control signal to said gain control input of said variable gain amplifier system.

15. An amplifier as defined in claim 14, wherein said logarithmic rectifier means includes said input transistor and additional transistors forming an amplifier having an input and an output, said feedback diode means on said integrated circuit chip being coupled between said input and said output of said amplifier of said logarithmic rectifier means, and said feedback diode means having a non-linear characteristic to obtain a feedback signal such as to obtain said logarithmic response characteristic.

16. An amplifier as defined in claim 15, wherein said amplifier of said logarithmic rectifier means includes an output transistor, and offset diode means coupled to said feed back diode means and coupled in series with said output transistor.

17. An amplifier as defined in claim 16, wherein said feedback diode means includes a diode coupled between said input of said amplifier and one end of said offset diode means and an oppositely poled diode coupled between said input of said amplifier and an opposite end of said offset diode means.

18. An amplifier as defined in claim 13, wherein said variable gain amplifier system includes a variable resistance having a resistance controlled by said control signal applied to said gain control input and a reactive impedance connected with said variable resistance to provide a gain control impedance which controls the gain of said variable gain amplifier system a function of the value of said variable resistance and the frequency of a signal to be amplified.

19. An amplifier as defined in claim 18, wherein amplifier system includes an amplifier having an input and an output, and a feedback circuit including said gain control impedance connected between said output and said input.

20. A hearing aid as defined in claim 18, wherein said feedback circuit includes a resistance connected in series with said gain control impedance to said output of said amplifier, and a feedback coupling between said input of said amplifier and a point between said resistance and said gain control impedance.

21. An amplifier as defined in claim 20, wherein said reactive impedance includes a capacitor connected in series with said variable resistance.

22. An amplifier as defined in claim 14, wherein said compression ratio control circuit includes a capacitor, means responsive to said output signal from said logarithmic rectifier circuit to charge said capacitor to a value corresponding to said peak value of said output signal, and DC amplifier means for responding to the voltage of said capacitor to develop a gain control signal for application to said gain control input of said variable gain amplifier system.

23. A hearing aid as defined in claim 22, wherein said DC amplifier means includes a transistor having a base electrode connected to said capacitor and wherein said compression ratio control circuit includes means for applying a current to said capacitor to charge said capacitor in one direction and to apply a biasing current to said base electrode of said transistor of said DC amplifier means, and detector diode means coupling said output signal from said logarithmic rectifier circuit to said capacitor to charge said capacitor in an opposite direction in response to said peak value of said output signal and to provide a level shift between said base electrode of said transistor of said DC amplifier means and said output of said logarithmic rectifier means.

24. An amplifier as defined in claim 22, wherein said DC amplifier means includes an adjustable compression ratio control resistor connected to ground and operative to control the DC gain of said amplifier.

25. A hearing aid including microphone means for developing an input electrical signal in response to an applied audio signal, receiver means for developing an audio output signal in response to an applied electrical signal, a battery, amplifier means arranged for energization from said battery and for receiving said input electrical signal from said microphone means and applying a corresponding output signal to said receiver means, a variable attenuator circuit associated with said amplifier means for attenuation of signals developed by said microphone means, a rectifier circuit for receiving signals from said amplifier means and developing a DC control signal proportional to signal amplitudes above a certain threshold level and for applying said control signal to said variable attenuator circuit, and an integrated circuit chip including transistors and other components associated with said amplifier means and variable attenuator and rectifier circuit, wherein said rectifier circuit is a variable threshold full-wave rectifier circuit which comprises reference potential means for developing two different reference potentials at first and second circuit points, a pair of semi-conductor junctions connected between said first and second circuit points and a third circuit point, means including a capacitor for coupling said third circuit point to said amplifier means, the charge of said capacitor being changed in one direction through current flow through one of said pair of semi-conductor junctions during half cycles of an applied signal of one polarity and being changed in an opposite direction through current flow through the other of said pair of semi-conductor junctions during half cycles of an applied signal of an opposite polarity, means for developing an output signal in response to current flow through one of said pair of semi-conductor junctions above a certain level, and means for controlling said reference potential means to control said reference potentials and control the signal level above which said output signal is developed.

26. A hearing aid as defined in claim 25, including a variable level-control resistor for controlling said threshold level and having one terminal connected to ground and a second terminal connected to said rectifier circuit.

27. A hearing aid as defined in claim 26 wherein said threshold level in decibels is a generally linear function of the resistance of said variable level-control resistor.

* * * * *